(12) United States Patent
Kobayashi

(10) Patent No.: US 12,068,354 B2
(45) Date of Patent: Aug. 20, 2024

(54) PHOTOELECTRIC CONVERSION DEVICE, PHOTOELECTRIC CONVERSION SYSTEM, MOVING BODY, AND SIGNAL PROCESSING METHOD THAT CAN CHANGE AN OUTPUT SIGNAL ACCORDING TO A SIGNAL LEVEL DETERMINATION

(71) Applicant: CANON KABUSHIKI KAISHA, Tokyo (JP)

(72) Inventor: Daisuke Kobayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 403 days.

(21) Appl. No.: 17/241,269

(22) Filed: Apr. 27, 2021

(65) Prior Publication Data

US 2021/0375975 A1 Dec. 2, 2021

(30) Foreign Application Priority Data

May 28, 2020 (JP) .................... 2020-093404

(51) Int. Cl.
| | |
|---|---|
| *H01L 27/146* | (2006.01) |
| *H04N 25/57* | (2023.01) |
| *H04N 25/70* | (2023.01) |
| *H04N 25/75* | (2023.01) |

(52) U.S. Cl.
CPC .. *H01L 27/14643* (2013.01); *H01L 27/14621* (2013.01); *H01L 27/14627* (2013.01); *H04N 25/57* (2023.01); *H04N 25/70* (2023.01); *H04N 25/75* (2023.01)

(58) Field of Classification Search
CPC ......... H01L 27/14643; H01L 27/14621; H01L 27/14627; H04N 25/57; H04N 25/70; H04N 25/75; H04N 25/131; H04N 25/133; H04N 25/585; H04N 25/705
See application file for complete search history.

(56) References Cited

U.S. PATENT DOCUMENTS

| | | |
|---|---|---|
| 9,142,575 B2 | 9/2015 | Kobayashi |
| 9,900,539 B2 | 2/2018 | Yamasaki |
| 10,194,103 B2 | 1/2019 | Saito |

(Continued)

FOREIGN PATENT DOCUMENTS

| | | |
|---|---|---|
| JP | 2013-149743 A | 8/2013 |
| JP | 2016-208139 A | 12/2016 |

(Continued)

*Primary Examiner* — Luong T Nguyen
(74) *Attorney, Agent, or Firm* — Venable LLP

(57) ABSTRACT

Provided is a photoelectric conversion device including: a photoelectric conversion unit including one microlens and a plurality of photoelectric conversion elements, a readout circuit unit configured to read out a first signal based on charges accumulated by a first photoelectric conversion element of the plurality of photoelectric conversion elements and a second signal based on charges accumulated by a second photoelectric conversion element of the plurality of photoelectric conversion elements, and a signal processing unit configured to, according to a determination result based on at least one of the first signal and the second signal, output a third signal obtained by adding the first signal and the second signal or output a fourth signal by replacing the third signal with the fourth signal different from the third signal.

13 Claims, 13 Drawing Sheets

(56) References Cited

U.S. PATENT DOCUMENTS

| | | | |
|---|---|---|---|
| 10,249,678 B2 | 4/2019 | Ryoki | |
| 10,504,949 B2 | 12/2019 | Kobayashi | |
| 10,834,354 B2 | 11/2020 | Kobayashi | |
| 2008/0211945 A1* | 9/2008 | Hong | H04N 23/84 348/294 |
| 2015/0062394 A1* | 3/2015 | Ikeda | H04N 25/778 348/301 |
| 2015/0279898 A1 | 10/2015 | Kobayashi | |
| 2016/0309102 A1* | 10/2016 | Koizumi | H04N 25/575 |
| 2017/0150071 A1* | 5/2017 | Otsubo | H01L 27/14645 |
| 2019/0252425 A1* | 8/2019 | Ogawa | H01L 27/14612 |
| 2020/0066772 A1 | 2/2020 | Kobayashi | |

FOREIGN PATENT DOCUMENTS

| | | | |
|---|---|---|---|
| JP | 2017-195342 A | 10/2017 | |
| JP | 2018-26760 A | 2/2018 | |

* cited by examiner

PHOTOELECTRIC CONVERSION DEVICE, PHOTOELECTRIC CONVERSION SYSTEM, MOVING BODY, AND SIGNAL PROCESSING METHOD THAT CAN CHANGE AN OUTPUT SIGNAL ACCORDING TO A SIGNAL LEVEL DETERMINATION

BACKGROUND OF THE INVENTION

Field of the Invention

The present invention relates to a photoelectric conversion device, a photoelectric conversion system, a moving body and a signal processing method.

Description of the Related Art

In a photoelectric conversion device, there is a case where a signal generated by a plurality of photoelectric conversion elements is processed as one pixel signal. Japanese Patent Application Laid-Open No. 2013-149743 describes a technique to be used in this case that a proper signal can be obtained even when there is a difference in sensitivity or incident light quantity between a plurality of photoelectric conversion elements by lowering the potential barrier between the plurality of photoelectric conversion elements.

In a technique such as Japanese Patent Application Laid-Open No. 2013-149743, there is a case where the quality of a signal output from each of a plurality of photoelectric conversion elements deteriorates due to saturation. Japanese Patent Application Laid-Open No. 2016-208139 discloses a technique capable of reducing deterioration in signal quality due to signal saturation. In Japanese Patent Application Laid-Open No. 2016-208139, when a level of a first signal based on one photoelectric conversion element is saturated, the first signal is replaced by a third signal obtained by correcting a second signal based on the other photoelectric conversion element.

However, in the technique disclosed in Japanese Patent Application Laid-Open No. 2016-208139, it is necessary to prepare a large amount of data for correction in order to perform correction processing of the second signal. Therefore, it is sometimes required to reduce the effect of signal saturation on signal quality by a method different from that disclosed in Japanese Patent Application Laid-Open No. 2016-208139.

SUMMARY OF THE INVENTION

The present invention intends to provide a photoelectric conversion device, a photoelectric conversion system, a moving body, and a signal processing method that can reduce the effect of signal saturation on signal quality.

According to an aspect of the present invention, there is provided a photoelectric conversion device including: a photoelectric conversion unit including one microlens and a plurality of photoelectric conversion elements, a readout circuit unit configured to read out a first signal based on charges accumulated by a first photoelectric conversion element of the plurality of photoelectric conversion elements and a second signal based on charges accumulated by a second photoelectric conversion element of the plurality of photoelectric conversion elements, and a signal processing unit configured to, according to a determination result based on at least one of the first signal and the second signal, output a third signal obtained by adding the first signal and the second signal or output a fourth signal by replacing the third signal with the fourth signal different from the third signal.

According to another aspect of the present invention, there is provided a photoelectric conversion system including: a photoelectric conversion device that includes a photoelectric conversion unit including one microlens and a plurality of photoelectric conversion elements, and a readout circuit unit configured to read out a first signal based on charges accumulated by a first photoelectric conversion element of the plurality of photoelectric conversion elements and a second signal based on charges accumulated by a second photoelectric conversion element of the plurality of photoelectric conversion elements, and a signal processing unit configured to, according to a determination result based on at least one of the first signal and the second signal, output a third signal obtained by adding the first signal and the second signal or output a fourth signal by replacing the third signal with the fourth signal different from the third signal.

According to another aspect of the present invention, there is provided a signal processing method processing a signal output from a photoelectric conversion unit including one microlens and a plurality of photoelectric conversion elements, the signal processing method including: reading out a first signal based on charges accumulated by a first photoelectric conversion element of the plurality of photoelectric conversion elements and a second signal based on charges accumulated by a second photoelectric conversion element of the plurality of photoelectric conversion elements, and according to a determination result based on at least one of the first signal and the second signal, outputting a third signal obtained by adding the first signal and the second signal or outputting a fourth signal by replacing the third signal with the fourth signal different from the third signal.

Further features of the present invention will become apparent from the following description of exemplary embodiments with reference to the attached drawings.

DESCRIPTION OF THE EMBODIMENTS

First Embodiment

Preferred embodiments of the present invention will now be described in detail in accordance with the accompanying drawings. First, a solid state imaging device and a signal processing method according to a first embodiment of the present invention will be described with reference to FIGS. 1 to 8. In the present embodiment, an example of a solid state imaging device which is a type of photoelectric conversion device to which the present invention may be applied will be described, but the present invention is not limited thereto. Examples of the photoelectric conversion device to which the present invention can be applied include a solid state imaging device, a focus detection device, a ranging device, a time of flight (TOF) camera, or the like.

Figure 1:
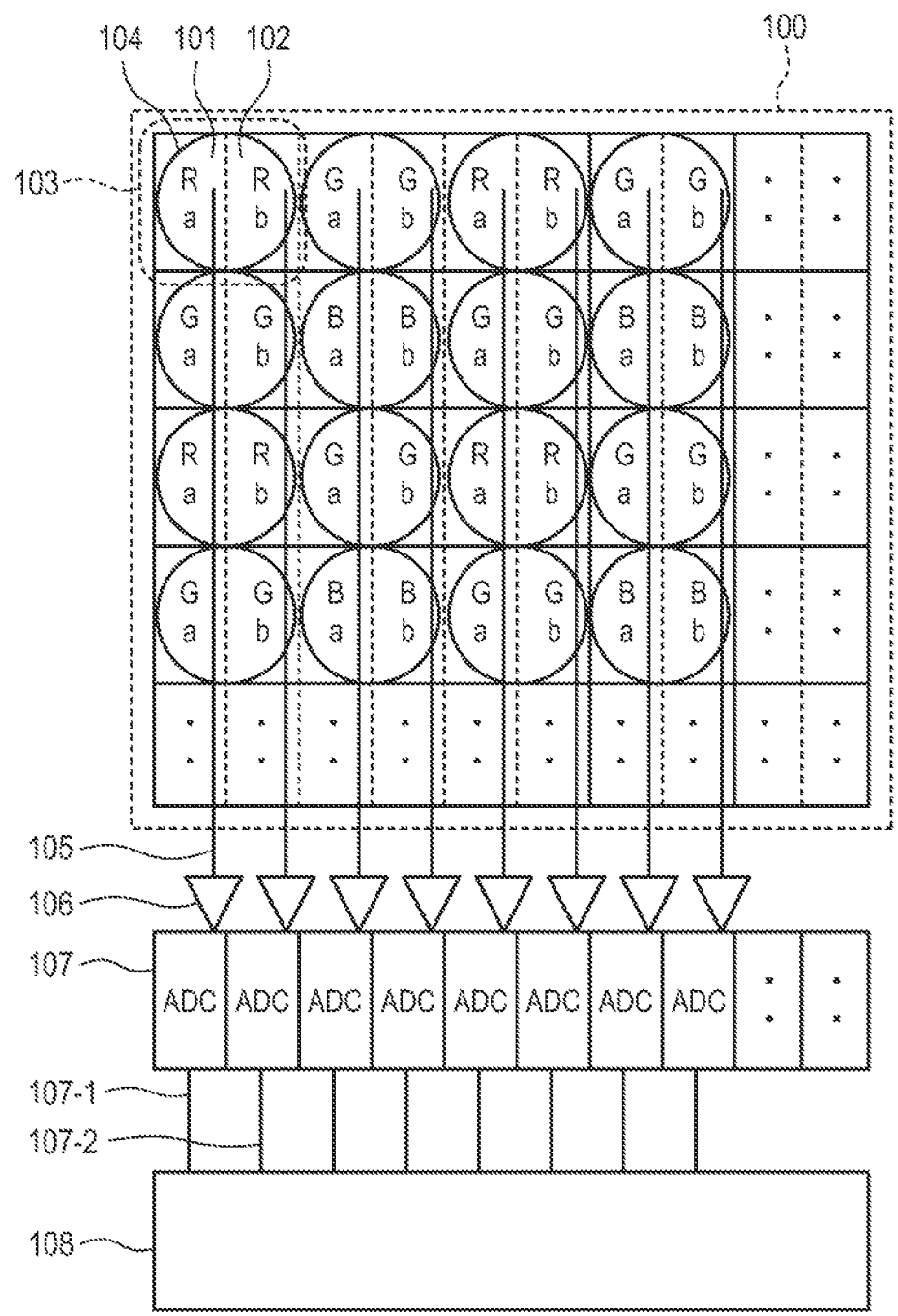
FIG. 1 is a schematic diagram illustrating a configuration example of a solid state imaging device according to a first embodiment of the present invention.
Figure 2:
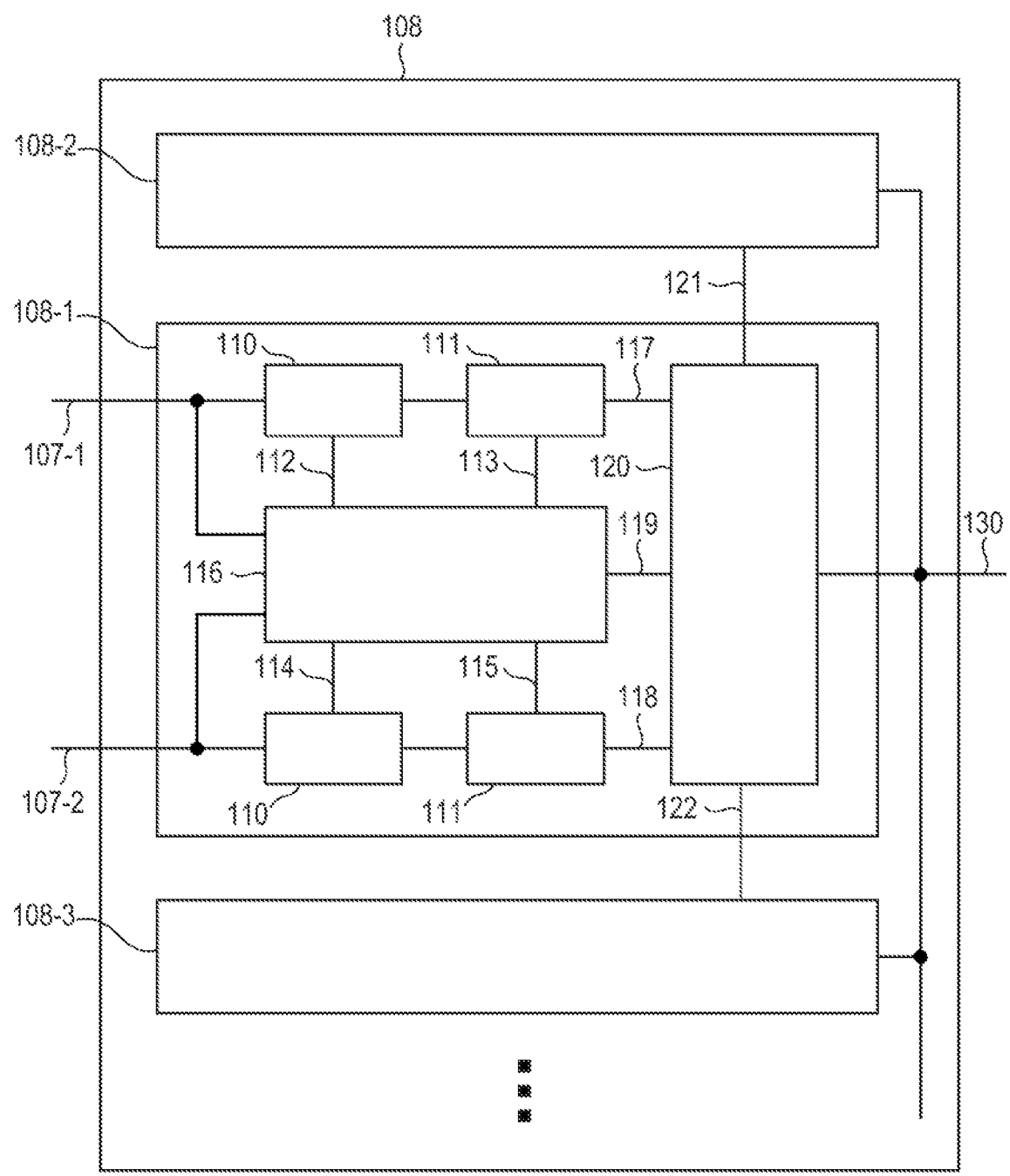
FIG. 2 is a schematic diagram illustrating a configuration example of a digital signal processor according to the first embodiment of the present invention.
Figure 3:
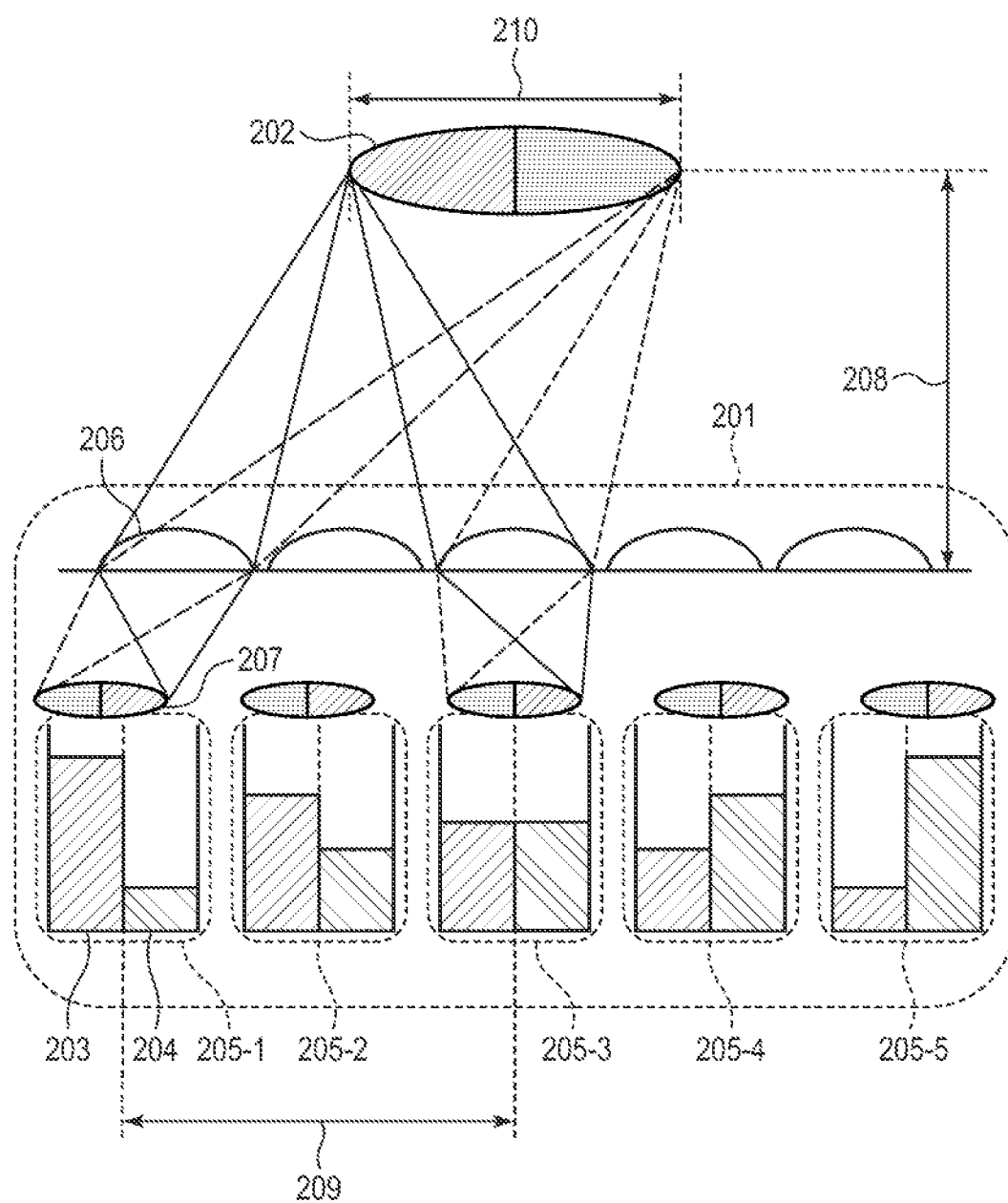
FIG. 3 is a schematic sectional view diagram illustrating an example of imaging unit including the solid state imaging device according to the first embodiment of the present invention.
Figure 4:
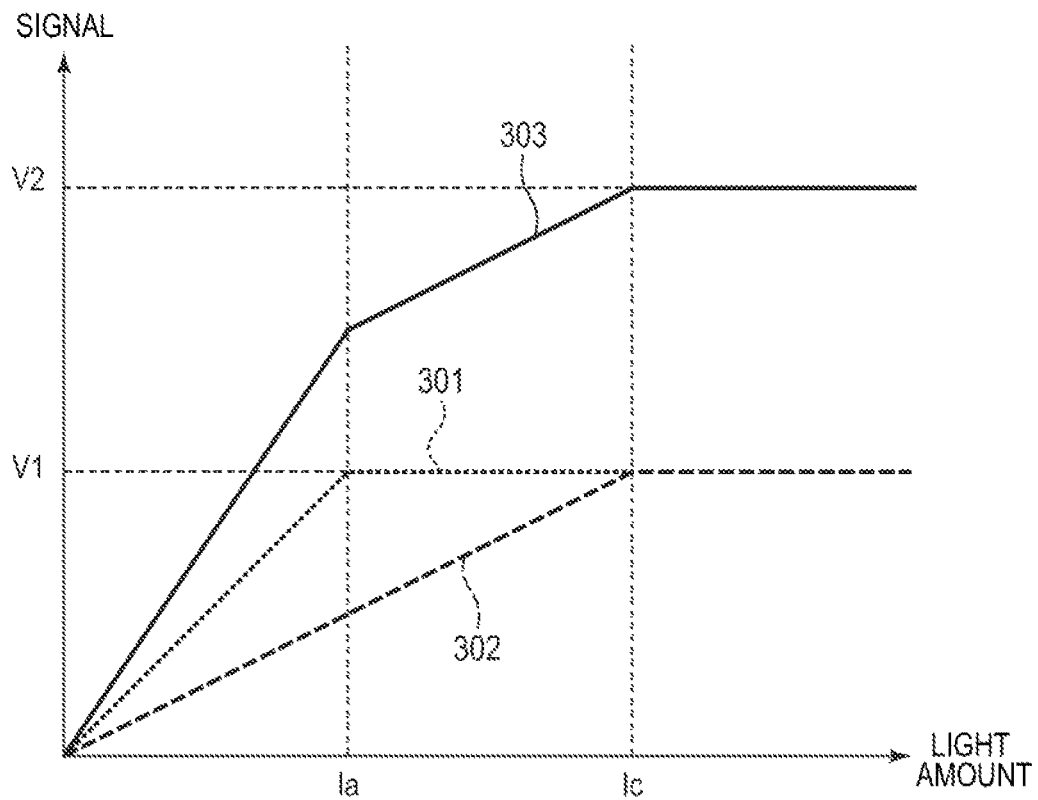
FIG. 4 is a graph illustrating an example of an input/output characteristic before performing signal processing according to the first embodiment of the present invention.
Figure 5:
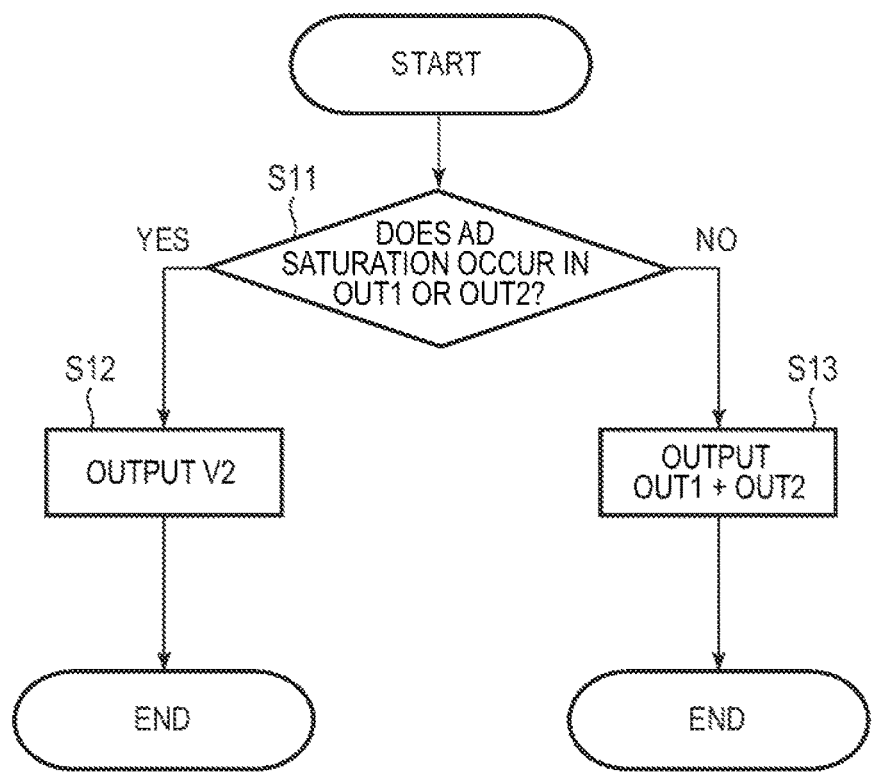
FIG. 5 is a flowchart illustrating a signal processing method in the solid state imaging device according to the first embodiment of the present invention.
Figure 6:
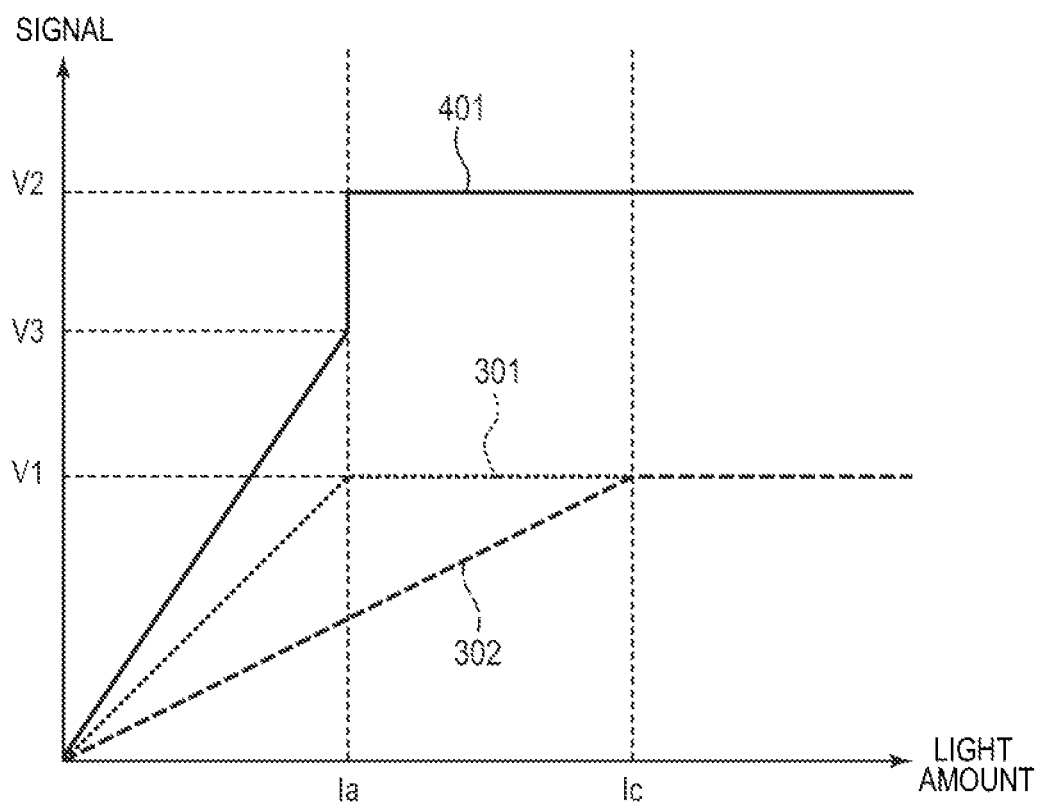
FIG. 6 is a graph illustrating an example of an input/output characteristic after performing signal processing according to the first embodiment of the present invention.
Figure 7:
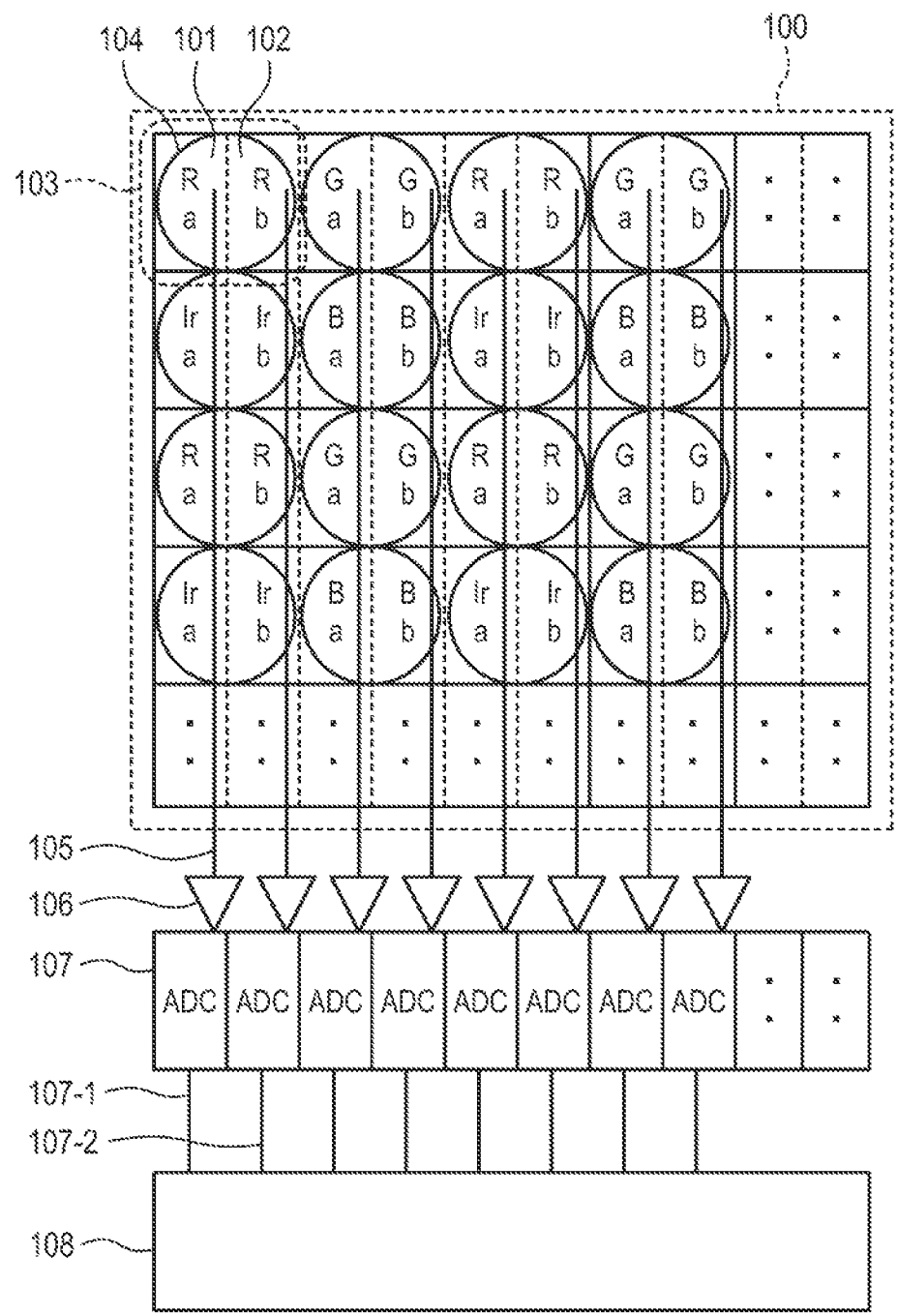
FIG. 7 is a schematic diagram illustrating another configuration example of the solid state imaging device according to the first embodiment of the present invention.
Figure 8:
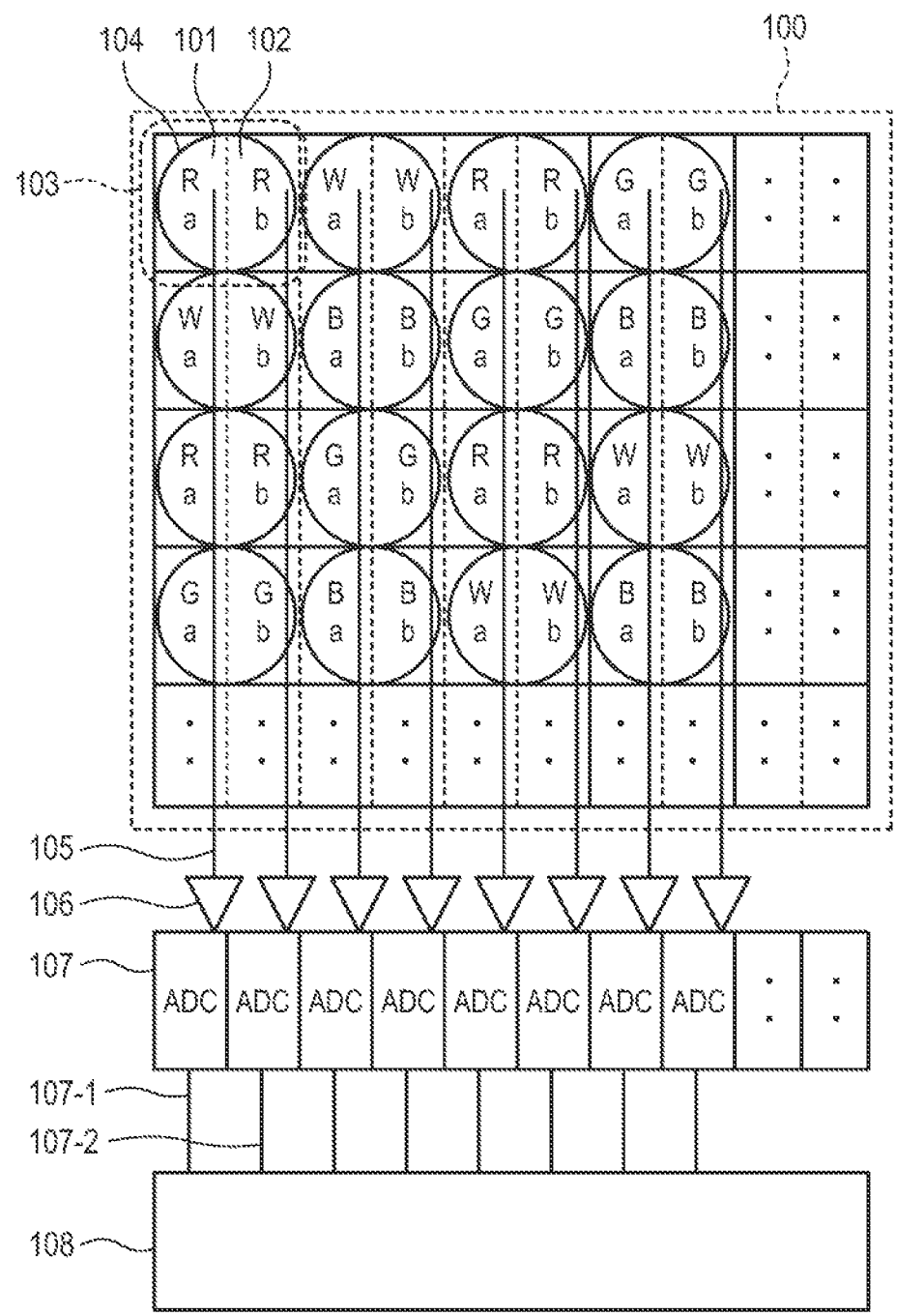
FIG. 8 is a schematic diagram illustrating yet another configuration example of the solid state imaging device according to the first embodiment of the present invention.

FIG. 1 is a schematic diagram illustrating a configuration example of a solid state imaging device according to the present embodiment. FIG. 2 is a schematic diagram illustrating a configuration example of a digital signal processor according to the present embodiment. FIG. 3 is a schematic sectional view diagram illustrating an example of an imaging unit including the solid state imaging device according to the present embodiment. FIG. 4 is a graph illustrating an example of an input/output characteristic before performing signal processing according to the present embodiment. FIG. 5 is a flowchart illustrating a signal processing method in the solid state imaging device according to the present embodiment. FIG. 6 is a graph illustrating an example of an input/output characteristic after performing signal processing according to the present embodiment. FIG. 7 is a schematic diagram illustrating another configuration example of the solid state imaging device according to the present embodiment. FIG. 8 is a schematic diagram illustrating yet another configuration example of the solid state imaging device according to the present embodiment.

First, the structure of the solid state imaging device according to the present embodiment will be described with reference to FIGS. 1 to 3. As illustrated in FIG. 1, a solid state imaging device of the present embodiment, such as a CMOS image sensor, includes an imaging area 100 (photoelectric conversion area) in which a plurality of photoelectric conversion units 103 are arranged in a two-dimensional array along the row direction and the column direction. The imaging area 100 may include, but is not limited to, an array of 1080 rows by 1920 columns of photoelectric conversion units 103, for example. FIG. 1 illustrates only an array of four rows by four columns of photoelectric conversion units 103 extracted from those.

Each photoelectric conversion unit 103 includes two photoelectric conversion elements 101, 102, one microlens 104, and a color filter (not shown). In each photoelectric conversion unit 103, the light passing through the microlens 104 passes through a color filter having one of a plurality of colors and is detected by a photoelectric conversion element 101 and a photoelectric conversion element 102. With such a structure, it is possible to perform focus detection of the phase difference method using a signal obtained from the photoelectric conversion element 101 and a signal obtained from the photoelectric conversion element 102. Further, by adding the signal obtained from the photoelectric conversion element 101 and the signal obtained from the photoelectric conversion element 102, signal data for pixels forming a captured image can be obtained.

In FIG. 1, references a, b illustrated in the photoelectric conversion elements 101 and 102 are intended for A signal and B signal, respectively, which are color signals obtained by a pupil division of right and left directions. That is, the photoelectric conversion element 101 is a photoelectric conversion element for obtaining the A signal, and the photoelectric conversion element 102 is a photoelectric conversion element for obtaining the B signal. Further, references R, G, and B denote colors of the color filters, R denotes a red filter, G denotes a green filter, and B denotes a blue filter. Color filters having the same color are assigned to the two photoelectric conversion elements 101, 102 constituting one photoelectric conversion unit 103. Although FIG. 1 illustrates an example in which the color filters are arranged in a so-called Bayer arrangement, the arrangement of the color filters is not limited to thereto.

In the imaging area 100, a plurality of signal output lines 105 are arranged extending in the column direction. two signal output lines 105 are arranged in each column. These two signal output lines 105 are signal lines for outputting A signals from the photoelectric conversion elements 101 of the photoelectric conversion units 103 arranged in the column direction on one side, and outputting B signals from the photoelectric conversion elements 102 of the photoelectric conversion units 103 arranged in the column direction on the other side. The A signal and the B signal are output from the photoelectric conversion elements 101, 102 to the signal output line 105 via a readout circuit in pixels (not shown) provided in the photoelectric conversion unit 103, respectively.

Each signal output line 105 is connected via a column amplifier 106 having a variable or fixed amplification factor to an analog-to-digital (AD) converter 107. In the following description, the column amplifier 106 and the AD converter 107 may be collectively referred to as "circuit unit" or "readout circuit unit". The AD converter 107 is connected to a digital signal processor (hereinafter referred to as "DSP") 108. The AD converter 107 converts the analog signal input from the column amplifier 106 into a digital signal and outputs the digital signal to the DSP 108.

FIG. 2 illustrates a configuration example of the DSP 108 according to the present embodiment. The DSP 108 is a signal processing unit including processing units 108-1, 108-2, 108-3, . . . arranged corresponding to the columns of the photoelectric conversion units 103. The processing unit 108-1 is a block corresponding to a column of photoelectric conversion units 103 of interest. The processing units 108-2, 3 are blocks corresponding to photoelectric conversion units 103 of a column adjacent to the photoelectric conversion units 103 corresponding to the processing unit 108-1. In the following, the processing unit 108-1 will be mainly described, but other processing units include the same configuration.

The processing unit 108-1 includes two gain addition units 110, two offset addition units 111, a signal determination unit 116, and an adder 120. The signal output from the AD converter 107 is input via an output line 107-1 corresponding to the photoelectric conversion element 101 or an output line 107-2 corresponding to the photoelectric conversion element 102 to the processing unit 108-1.

A signal input from an output line 107-1 is input via a first gain addition unit 110, a first offset addition unit 111 and a wiring 117 to an adder 120. A signal input from an output line 107-2 is input via a second gain addition unit 110, a second offset addition unit 111 and a wiring 118 to an adder 120.

Further, signals input from the output lines 107-1, 107-2 are also input to the signal determination unit 116. The signal determination unit 116 controls, via wirings 112, 113, 114, 115, and 119, the two gain addition units 110, the two offset addition units 111, and the adder 120.

The gain addition unit 110 adds a gain according to the control from the signal determination unit 116 to the input signal and then outputs it. The offset addition unit 111 adds an offset according to the control from the signal determination unit 116 to the input signal and then outputs it. The gain addition unit 110 and the offset addition unit 111 can correct linearity and offset with respect to the signal output from the AD converter 107 by performing the signal processing.

The adder 120 has a function of adding input signals to generate signal data for pixels for forming a captured image and outputting the signal data to a common output line 130. Further the adder 120 also has a function of replacing the input signal with a signal indicating a predetermined voltage. The signal data output from the output line 130 is output to the outside of the solid state imaging device via an output circuit (not shown). Information such as a signal level and a determination result used for processing in the adder 120 may be supplied via the wirings 121, 122 to adders of the other processing units 108-2, 108-3.

The signal determination unit 116 has a function of determining the saturation of each of the signals corresponding to the photoelectric conversion elements 101, 102 based on the signal level. The signal determination unit 116 controls, based on the determination result of the signal level or saturation, via the wirings 112, 113, 114, 115, and 119, the two gain addition units 110, the two offset addition units 111, and the adder 120.

Note that, the configuration of the processing unit 108-1 and the signal process performed by the processing unit 108-1 or the like are not limited to those described in the present embodiment. In FIG. 1 and FIG. 2, each of the output lines 107-1, 107-2, the wirings 117,118, and the output line 130 is illustrated as a single wiring, but depending on the transmission type of the signal, it may be a plurality of wirings.

FIG. 3 is a schematic sectional view illustrating an imaging unit including the solid state imaging device 201 of the present embodiment. The light passed through the exit pupil 202 of the photographing lens enters a solid state imaging device 201 arranged at a distance of the exit pupil distance 208. As described above, the solid state imaging device 201 includes a photoelectric conversion unit 205 including two photoelectric conversion elements 203, 204, and a microlens 206. Note that, in FIG. 3, the same components as those in FIG. 1 are denoted by different references for convenience of explanation. The two photoelectric conversion elements 203, 204 in FIG. 3 correspond to the photoelectric conversion elements 101, 102 in FIG. 1, and the photoelectric conversion unit 205 corresponds to the photoelectric conversion unit 103 in FIG. 1. The microlens 206 corresponds to the microlens 104 in FIG. 1. The same applies to the following description. Note that, in the following description, like the photoelectric conversion unit 205-1 or the like, a branch number is attached to a reference to indicate one of the plurality of photoelectric conversion units 205.

Typically, the size of the exit pupil 202 of the photographing lens is in the order of millimeters, while the size of the photoelectric conversion unit 205 is in the order of micrometers. Because description with the actual proportion will make the illustration difficult, a part of the components of the solid state imaging device 201 is extracted and enlarged for the purpose of illustration. That is, in FIG. 3, the photoelectric conversion unit 205-3 is an enlarged view of the center part of the photoelectric conversion unit 205 where the image height is zero, the photoelectric conversion units 205-1, 205-5 are enlarged views of the photoelectric conversion unit 205 at the positions where the left and right image heights are high, and the photoelectric conversion units 205-2, 205-4 are enlarged views of the photoelectric conversion unit 205 at the positions where the left and right image heights are medium. The exit pupil 202 of the photographing lens forms an exit pupil image 207 on the surface of the photoelectric conversion unit 205 by the microlens 206. The center of the exit pupil image 207 and the center of the photoelectric conversion unit 205 do not coincide with each other except when the exit pupil distance 208 and the pitch of the microlens 206 satisfy specific conditions at a high image height position. Therefore, an incident light quantity difference, that is, a sensitivity difference is generated between the 2 photoelectric conversion elements 203, 204 included in one photoelectric conversion unit 205. Note that, the specific condition is the relation between the exit pupil distance 208 and the pitch of the microlens 206 when the center of the exit pupil image 207 coincides with the center of the photoelectric conversion unit 205.

In FIG. 3, the area of the hatched parts illustrated in the photoelectric conversion elements 203, 204 corresponds to the sensitivity determined by the amount of signal charges accumulated in the photoelectric conversion elements 203, 204. This drawing conceptually illustrates how the sensitivity difference between the photoelectric conversion elements changes according to the image height when the exit pupil distance 208 with respect to the pitch of the microlens 206 viewed in the image height direction (in this case, the horizontal direction) is shorter than in the case where the specific conditions described above are satisfied. Note that, the change in the center position of the exit pupil image 207 is caused by the exit pupil distance 208 and the horizontal image height 209 of the imaging lens, and the change in the diameter of the exit pupil image 207 is caused by the pupil diameter 210 of the imaging lens. The center position and diameter of the exit pupil image 207 determine the amount of sensitivity difference between the photoelectric conversion element 203 and the photoelectric conversion element 204.

As described above, the signal data for the pixels forming the captured image is obtained by adding the signal data from the photoelectric conversion element 203 and the signal data from the photoelectric conversion element 204. When a sensitivity difference exists between the photoelectric conversion element 203 and the photoelectric conversion element 204, the signal of one photoelectric conversion element is significantly greater than the signal of the other photoelectric conversion element depending on imaging conditions, and only the signal data from the one photoelectric conversion element may be saturated. When saturation occurs in the signal data from one of the photoelectric conversion elements, the linearity of the input/output characteristic in the bright part of the captured image is lowered, and the lowered linearity causes a deterioration in image quality such as a color shift.

FIG. 4 is a graph illustrating an example of the input/output characteristic 301 of the photoelectric conversion element 203 having relatively high sensitivity, the input/output characteristic 302 of the photoelectric conversion element 204 having relatively low sensitivity, and the input/output characteristics 303 obtained by combining the input/output characteristics 301, 302. The horizontal axis indicates the input light quantity, and the vertical axis indicates the signal level of the digital data after an AD conversion.

In the example of FIG. 4, when the input light amount exceeds a certain constant input light amount Ia, the output signal from the photoelectric conversion element 203 is saturated in the circuit unit. A signal level when saturated in the circuit unit is a signal level V1. When the output signal from the photoelectric conversion element 204 exceeds an input light amount Ic which is greater than the input light amount Ia, the output signal is saturated in the circuit unit. In such a case, as illustrated in FIG. 4, the slope of the input/output characteristic 303 obtained by combining the input/output characteristics 301, 302 is small at the input light amount Ia or more, and the linearity decreases. Note that, the input/output characteristic 303 at an input light amount Ic or more is signal level V2 (=2×V1) obtained by adding a signal level V1 indicating circuit saturation of an output signal from the photoelectric conversion element 203 and a signal level V1 indicating circuit saturation of an output signal from the photoelectric conversion element 204.

As an example of saturation in the circuit unit, AD saturation is cited. The AD saturation means that the output signal has reached the upper limit value of the digital signal. The upper limit value of the digital signal typically corresponds to a signal level of $2^n-1$ in the case of n bits. The signal level at which saturation occurs in the circuit unit is a predetermined signal level determined according to the configuration of the circuit unit. Note that, in the following description, saturation in the circuit unit is sometimes expressed as "AD saturation" for simplification, but this expression is not intended to limit saturation in the circuit unit to AD saturation. In the case of an analog signal, the voltage may be saturated at the upper limit value of the dynamic range of the circuit. In the present invention, saturation in the circuit unit includes not only AD saturation but also voltage saturation of the analog signal.

As described above, when AD saturation occurs in the output data from one photoelectric conversion element, the linearity of the image data obtained by adding the output data from the two photoelectric conversion elements 203, 204 lowers. The signal processing method according to the present embodiment reduces the effect on the image quality due to the lowering in the linearity of the image data caused by the AD saturation of the output data of one photoelectric conversion element.

Next, a signal processing method according to the present embodiment will be described with reference to FIG. 5 and FIG. 6. FIG. 5 is a flowchart illustrating a signal processing method according to the present embodiment. In the drawings, the signal OUT1 (first signal) represents a digital signal input from the first photoelectric conversion element 203 constituting the photoelectric conversion unit 205 via the AD converter 107 to the DSP 108. The signal OUT2 (second signal) represents a digital signal input from the second photoelectric conversion element 204 constituting the photoelectric conversion unit 205 via the AD converter 107 to the DSP 108.

In step S11, the signal determination unit 116 determines whether AD saturation occurs in the signal OUT1 or the signal OUT2. The determination process may be, for example, to determine whether the value of the signal OUT1 or the signal OUT2 has reached the upper limit value (saturation level) of the digital signal, or to determine whether the value of the signal OUT1 or the signal OUT2 has exceeded a predetermined determination threshold. The signal determination unit 116 controls an adder 120 based on the determination result.

If it is determined in step S11 that AD saturation occurs in the signal OUT1 or the signal OUT2 (YES in step S11), the process proceeds to step S12. If it is determined in step S11 that AD saturation occurs in neither the signal OUT1 nor the signal OUT2 (NO in step S11), the process proceeds to step S13.

In step S13, the adder 120 outputs a signal OUT1+OUT2 (third signal) obtained by adding the signal level indicated by the signal OUT1 and the signal level indicated by the signal OUT2. Thus, the signal OUT1+OUT2 is output to the outside via the output line 130.

In step S12, the adder 120 replaces the signal OUT1+OUT2 with a signal indicating that the signal level is V2 (fourth signal) and outputs it. This signal is output to the outside via the output line 130. As illustrated in FIG. 4, the signal level V2 is a level at the time of saturation of the signal OUT1+OUT2. That is, the signal level V2 corresponds to a level obtained by adding the saturation level of the signal OUT1 and the saturation level of the signal OUT2.

Note that, the signal determination unit 116 may further control the gain addition unit 110 and the offset addition unit 111 based on the determination result. Thus, the correction process in the gain addition unit 110 and the offset addition unit 111 can be adjusted according to the determination result.

FIG. 6 is a graph illustrating input/output characteristic after the signal processing method of the present embodiment is applied to the input/output characteristic of FIG. 4. In the input/output characteristics illustrated in FIG. 6, when the output from the photoelectric conversion element 203 is less than the input light amount Ia which causes AD saturation, the combined input/output characteristic 401 are equivalent to the input/output characteristic 303 illustrated in FIG. 4. However, when the output from the photoelectric conversion element 203 is greater than or equal to the input light amount Ia or greater than the signal level V3, the input/output characteristic 401 is the signal level V2 at the time of saturation.

In the input/output characteristic 303 illustrated in FIG. 4, the linearity is lowered in the light amount of the input light amount Ia or more. When the linearity of the input/output characteristic after the addition is lowered, a captured image in which the switching from the dark part to bright part is different from the actual state may be obtained when imaging an object having a large light quantity or an object having a large signal level. In the configuration of the present embodiment, by setting the signal level to V2 with the input light amount Ia or more as illustrated in FIG. 6, it is possible to make it difficult for the output characteristic in the area where the linearity lowers to affect the captured image, so that the effect of the linearity lowering in the input/output characteristic is reduced.

Therefore, a photoelectric conversion device that can reduce the effect of signal saturation on signal quality is provided.

Further, in the input/output characteristic 303 illustrated in FIG. 4, a color shift may occur in the added captured image. This can occur in a solid state imaging device including a plurality of color filters arranged as illustrated in FIG. 1. Typically, the transmittance of the color filter is designed to be different for each color. For a normal object, the sensitivity of each color has a relation of G>R>B. Therefore, when compared with the same light quantity, the signal level of the photoelectric conversion unit 103 where the color filters of G are arranged is relatively greater than the signal level of the photoelectric conversion unit 103 where the color filters of R and B are arranged. Therefore, for a normal object, the input light amount Ia at which the linearity of the input/output characteristic 303 starts to lower is the least in the photoelectric conversion unit 103 in which the color filter of G is arranged.

General image processing assumes that the ratio and linearity of R, G, and B sensitivities are constant within a predetermined light quantity range. Therefore, when the linearity of only G lowers with a certain amount of light, the ratio between the sensitivity of G and the sensitivity of R or B collapses, and the color of the captured image after image process may shift from the actual color of the object. For example, in a white object, when the linearity of G lowers and the relative sensitivities of R and B increase, a color shift may occur such that the color of the object, which is actually white, appears close to magenta.

In the present embodiment, the adders of the processing units 108-2, 108-3 illustrated in FIG. 2 are connected to the adder 120 of the processing unit 108-1 by wirings 121, 122. Thus, information such as the signal level and the determination result used in the process of the adder 120 may be shared with each other. Based on the shared information, the processing unit 108-1 and the processing units 108-2, 108-3 of adjacent columns may perform the signal process of the same content synchronously.

For example, it is assumed that, based on the determination result of the signal determination unit 116 in the signal processing unit 108-1, the process of step S12 in FIG. 5, that is, the process of outputting V2 has been performed. At this time, the adder 120 of the processing units 108-2, 108-3 may perform the process of outputting V2 in the same manner as the processing unit 108-1 regardless of the signal levels of the input signals OUT1 and OUT2. Further, in order to obtain the same output as the process of outputting V2 in the processing unit 108-1 in the processing units 108-2, 108-3, the correction process may be performed by the gain addition unit 110 and the offset addition unit 111 of the processing units 108-2, 108-3. In these examples, when the pixel signal read from the first photoelectric conversion unit 103 of a certain column is replaced with the signal level V2, the signal level is also replaced or corrected with V2 for the pixel signal read from the second photoelectric conversion unit 103 of an adjacent column. Thus, since the pixel signal of a certain color and the pixel signal of another color in the adjacent column are replaced or corrected to V2 synchronously, the color shift can be reduced.

The determination threshold of the saturation may be different for each color. For example, by making the determination threshold different according to the ratio of outputs due to the sensitivity difference of R, G, and B, the light amount in which the signal level of each color is replaced with V2 can be made close to each other. Thus, the effect of the color shift can be reduced.

In the present embodiment, an example has been described in which the signal OUT1+OUT2 is replaced or corrected to a signal level V2 obtained by adding a signal level V1 indicating circuit saturation of an output signal from the photoelectric conversion element 203 and a signal level V1 indicating circuit saturation of an output signal from the photoelectric conversion element 204. As another example, when the saturation levels of the photoelectric conversion elements 203, 204 are different, the signal level obtained by adding signal levels indicating circuit saturation levels of the photoelectric conversion elements 203, 204 may be used as the signal level V2. Further, the replacement or correction process of the present embodiment does not necessarily have to coincide with the signal level obtained by adding the circuit saturation levels of the photoelectric conversion elements 203, 204. That is, the process of replacing or correcting the signal OUT1+OUT2 to a signal level within a range which can be consider to be substantially a saturation level is also included in the scope of the present embodiment.

Note that, in FIG. 1, a general Bayer arrangement including three color filters of R, G, and B is illustrated, but the present invention is not limited thereto, and an arrangement other than this may be used, and the type of color filter may be different from this.

FIG. 7 is a schematic diagram illustrating another configuration example of the solid state imaging device according to the first embodiment. As illustrated in FIG. 7, in some of the photoelectric conversion units 103, instead of the green color filter (G), an infrared filter (Ir in FIG. 7) which transmits infrared rays and blocks visible light may be arranged.

FIG. 8 is a schematic diagram illustrating another configuration example of the solid state imaging device according to the first embodiment. As illustrated in FIG. 8, in some of the photoelectric conversion units 103, instead of the green color filter (G), a white filter (W in FIG. 8) that transmits all three colors of light of R, G, and B may be arranged.

Second Embodiment

A solid state imaging device and a signal processing method according to a second embodiment of the present invention will be described with reference to FIG. 9 and FIG. 10. Components similar to those of the solid state imaging device and the signal processing method according to the first embodiment illustrated in FIGS. 1 to 8 are denoted by the same reference, and description thereof will be omitted or simplified.

Figure 9:
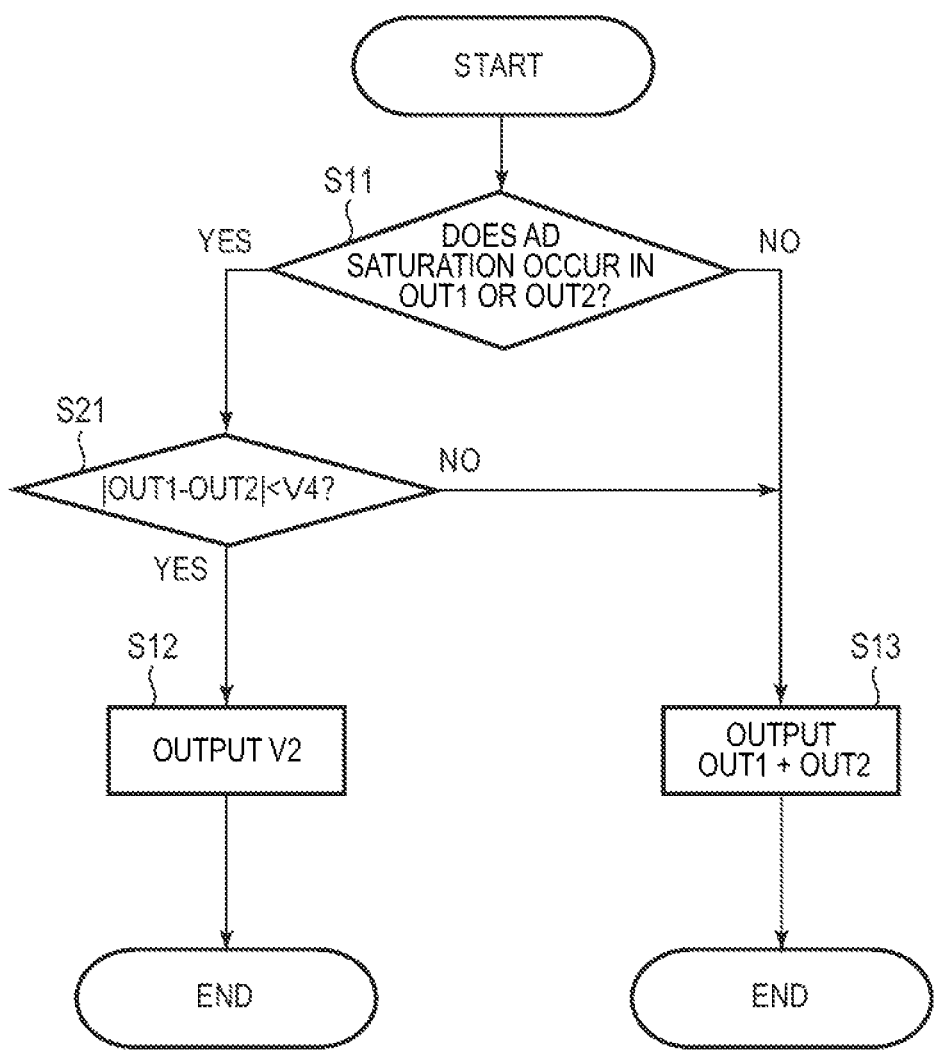
FIG. 9 is a flowchart illustrating a signal processing method in a solid state imaging device according to a second embodiment of the present invention.

FIG. 9 is a flowchart illustrating a signal processing method in the solid state imaging device according to the present embodiment. FIG. 10 is a graph illustrating an example of input/output characteristic obtained by the signal processing method in the solid state imaging device according to the present embodiment.

In the first embodiment, a signal processing method has been described in which, when it is determined that AD saturation occurs in the output from one photoelectric conversion element, the level of signal data for pixels forming a captured image is replaced with the saturation level. However, depending on the optical system or the object of the imaging device, there is a case where a difference in the amount of charge generated by the two photoelectric conversion elements is large. When the difference between the amounts of charges generated by the two photoelectric conversion elements is large, the signal level V3 described in the first embodiment is low. This is because when the sensitivity difference between the photoelectric conversion element 203 and the photoelectric conversion element 204 is large, the input light quantity Ia of the input/output characteristic 302 in FIG. 6 is low. For this reason, the output range of the input/output characteristic 401 after addition may be small. In the solid state imaging device of the present embodiment, the effect of the replacement process on the output range is reduced by changing the signal processing method from that of the first embodiment.

A signal processing method according to the present embodiment will be described with reference to FIG. 9. In step S11, the signal determination unit 116 performs the same determination process as in the first embodiment. If it is determined in step S11 that AD saturation occurs in the signal OUT1 or the signal OUT2 (YES in step S11), the process proceeds to step S21. If it is determined in step S11 that AD saturation occurs in neither the signal OUT1 nor the signal OUT2 (NO in step S11), the process proceeds to step S13. In step S13, the adder 120 outputs a signal OUT1+OUT2 obtained by adding the signal level indicated by the signal OUT1 and the signal level indicated by the signal OUT2.

In step S21, the signal determination unit 116 calculates an absolute value (|OUT1−OUT2|) of a difference between the signal level indicated by the signal OUT1 and the signal level indicated by the signal OUT2, and compares the absolute value of the difference with a signal level V4 which is a determination threshold.

If it is determined in step S21 that the absolute value of the difference is less than the signal level V4 (YES in step S21), the process proceeds to step S12. In step S12, the adder 120 replaces the signal OUT1+OUT2 with a signal indicating that the signal level is V2 and outputs it.

If it is determined in step S21 that the absolute value of the difference is equal to or greater than the signal level V4 (NO in step S21), the process proceeds to step S13. In step S13, the adder 120 outputs a signal OUT1+OUT2 obtained by adding the signal level indicated by the signal OUT1 and the signal level indicated by the signal OUT2.

Figure 10:
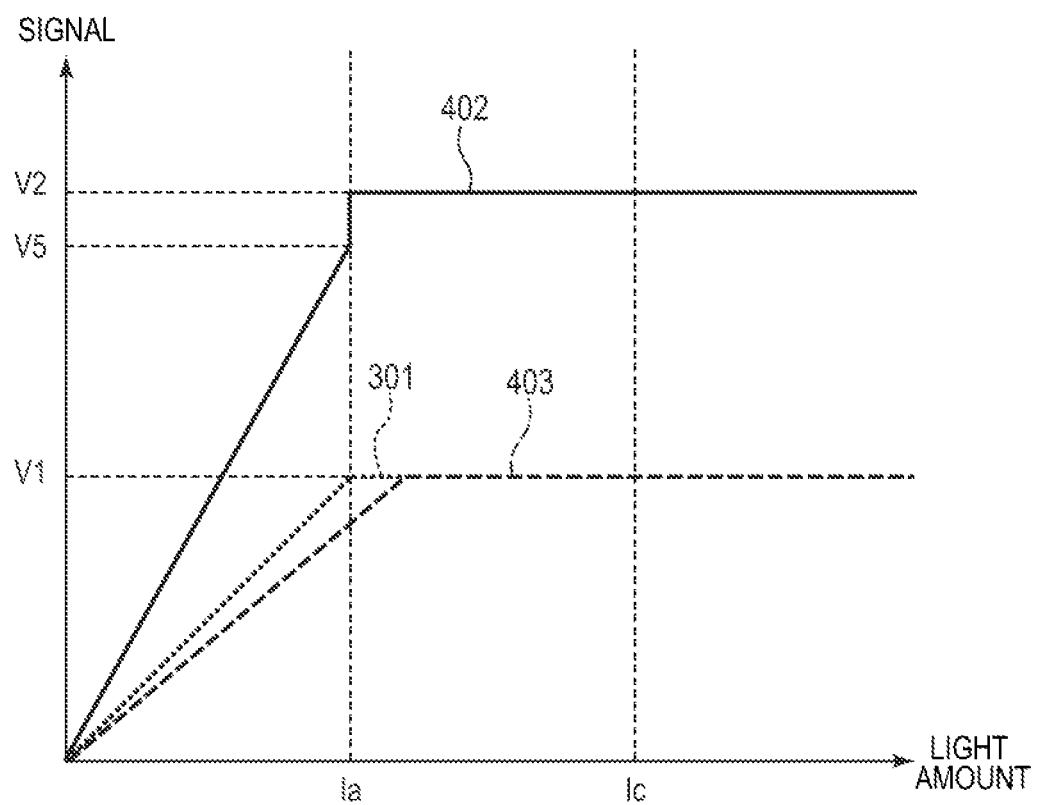
FIG. 10 is a graph illustrating an example of an input/output characteristic obtained by a signal processing method in the solid state imaging device according to the second embodiment of the present invention.

FIG. 10 is a graph illustrating an example of the input/output characteristic obtained by the signal processing method of the present embodiment. The input/output characteristics 402, 403 in FIG. 10 correspond to the input/output characteristics 401, 302 in FIG. 6, respectively. FIG. 10 illustrates a case where the sensitivity of the photoelectric conversion element 204 indicated in the input/output characteristic 403 is greater than the sensitivity of the photoelectric conversion element 204 indicated in the input/output characteristic 302 of FIG. 6. That is, the signal level V5 of the input/output characteristic 402 in the input light amount Ia of FIG. 10 is greater than the signal level V3 of the input/output characteristic 401 in the input light amount Ia of FIG. 6.

In the present embodiment, as illustrated in FIG. 10, the process of replacing the signal OUT1+OUT2 is performed only when the absolute value of the difference between the signal level indicated by the signal OUT1 and the signal level indicated by the signal OUT2 is sufficiently small, and the process of replacing is not performed when the absolute value of the difference is large as illustrated in FIG. 6. That is, when the amount of decrease in the output range caused by the replacement process is too large, it is determined not to perform the replacement process. Thus, according to the present embodiment, there is provided a solid state imaging device that can reduce the effect of the replacement process on the output range.

Note that, the signal level V4 can be appropriately set in consideration of design constraints such as an allowable amount of reduction of the output range. In the scene of step S21, since it has been determined in step S11 that AD saturation occurs in one of the signals OUT1 and OUT2, the process in step S21 may be the process of determining the absolute value of the other signal in which AD saturation occurs. If the absolute value of the other signal in which AD saturation does not occur is equal to or greater than a predetermined threshold, the process proceeds to step S12, where the signal OUT1+OUT2 is replaced with a signal indicating that the signal level is V2.

Third Embodiment

A solid state imaging device and a signal processing method according to a third embodiment of the present invention will be described with reference to FIG. 11 and FIG. 12. Components similar to those of the solid state imaging device and the signal processing method according to the first embodiment illustrated in FIGS. 1 to 8 are denoted by the same references, and description thereof will be omitted or simplified.

Figure 11:
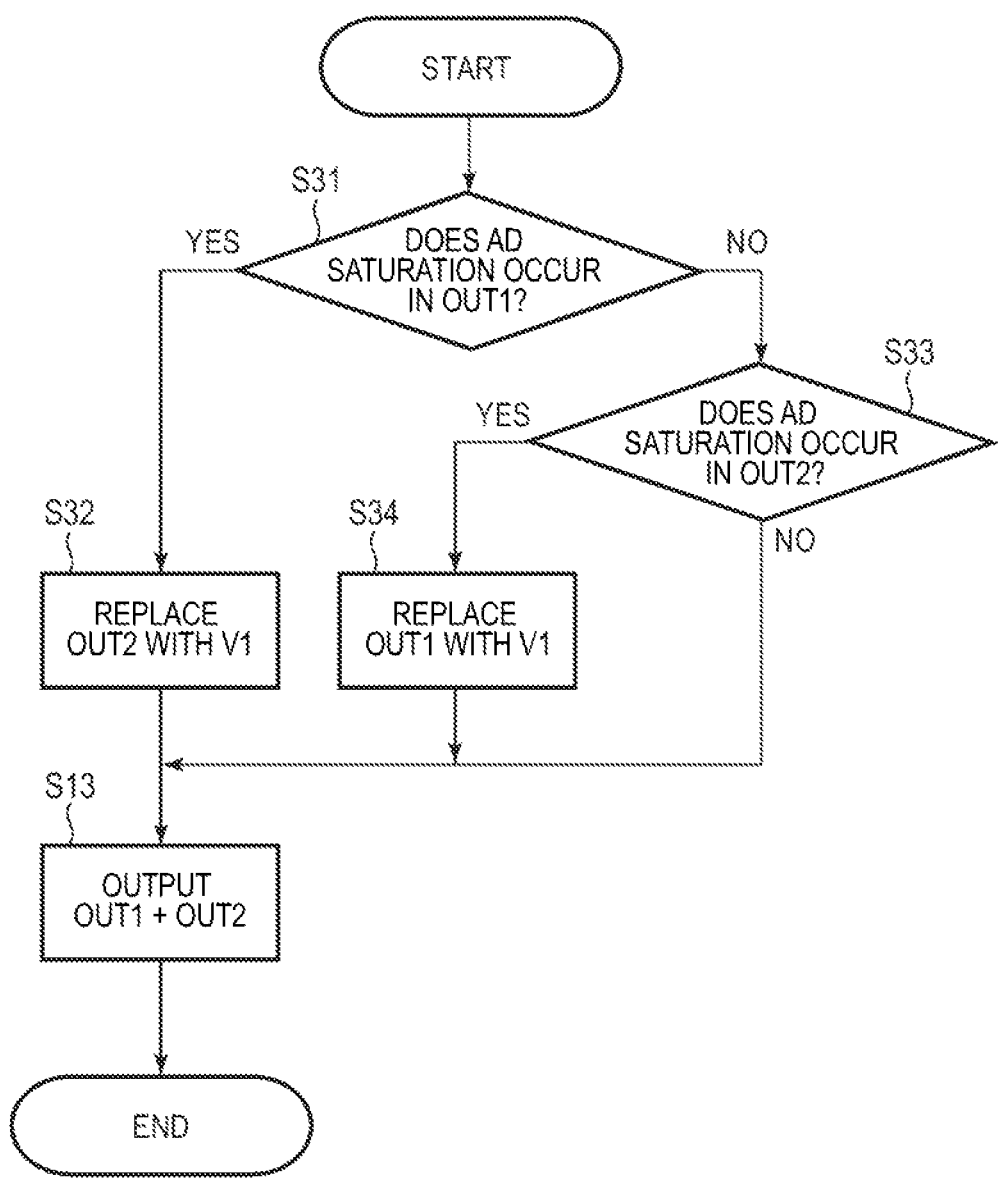
FIG. 11 is a flowchart illustrating a signal processing method in a solid state imaging device according to a third embodiment of the present invention.

FIG. 11 is a flowchart illustrating a signal processing method in the solid state imaging device according to the present embodiment. FIG. 12 is a graph illustrating an example of input/output characteristic obtained by the signal processing method in the solid state imaging device according to the present embodiment.

In the first embodiment, a signal processing method for processing input/output characteristics of signal data for pixels forming a captured image when the output from one photoelectric conversion element is determined to be occurred AD saturation has been described. In the signal process of the first embodiment, the adder 120 may perform an addition process for outputting the signal OUT1+OUT2 and a replacement process for replacing the output signal with the signal of the signal level V2. Therefore, in the first embodiment, since the adder 120 needs to perform two types of signal processes, the circuit scale of the adder 120 may be large. Thus, the circuit scale of the DSP 108 may also be large. The solid state imaging device of the present embodiment reduces the circuit scale of the DSP 108 by changing the signal processing method from that of the first embodiment.

A signal processing method according to the present embodiment will be described with reference to FIG. 11. In step S31, the signal determination unit 116 determines whether AD saturation occurs in the signal OUT1. If it is determined in step S31 that AD saturation occurs in the signal OUT1 (YES in step S31), the process proceeds to step S32. If it is determined in step S31 that AD saturation occurs in the signal OUT1 (NO in step S31), the process proceeds to step S33.

In step S32, the gain addition unit 110 or the offset addition unit 111 replaces the signal OUT2 with a signal indicating that the signal level is V1, and outputs the replaced signal to the adder 120. Note that, in step S31, since AD saturation also occurs in the signal OUT1, the signal level of the signal OUT1 is also V1, and therefore the signal levels of the signals OUT1 and OUT2 input to the adder 120 are both V1.

In step S33, the signal determination unit 116 determines whether AD saturation occurs in the signal OUT2. If it is determined in step S33 that AD saturation occurs in the signal OUT2 (YES in step S33), the process proceeds to step S34. If it is determined in step S33 that the AD saturation occurs in the signal OUT2 (NO in step S33), the process proceeds to step S13.

In step S34, the gain addition unit 110 or the offset addition unit 111 replaces the signal OUT1 with a signal indicating that the signal level is V1, and outputs the replaced signal to the adder 120. Note that, in step S33, since AD saturation also occurs in the signal OUT2, the signal level of the signal OUT2 is also V1, and therefore the signal levels of the signals OUT1 and OUT2 input to the adder 120 are both V1.

In step S13, the adder 120 outputs a signal OUT1+OUT2 obtained by adding the signal level indicated by the signal OUT1 and the signal level indicated by the signal OUT2. Thus, the signal OUT1+OUT2 is output to the outside via the output line 130.

If it is determined to be YES in either step S31 or step S33, the signal levels of the signal OUT1 and signal OUT2 input to the adder 120 are both V1, so that the output of the adder 120 is 2×V1, that is, V2. If it is determined to be NO in either step S31 or step S33, neither the signal OUT1 nor the signal OUT2 is saturated, and the added signal OUT1+OUT2 is output directly from the adder 120. Therefore, the relation between the presence or absence of saturation of the signals OUT1 and OUT2 and the output signal in FIG. 11 is the same as that in the first embodiment.

Figure 12:
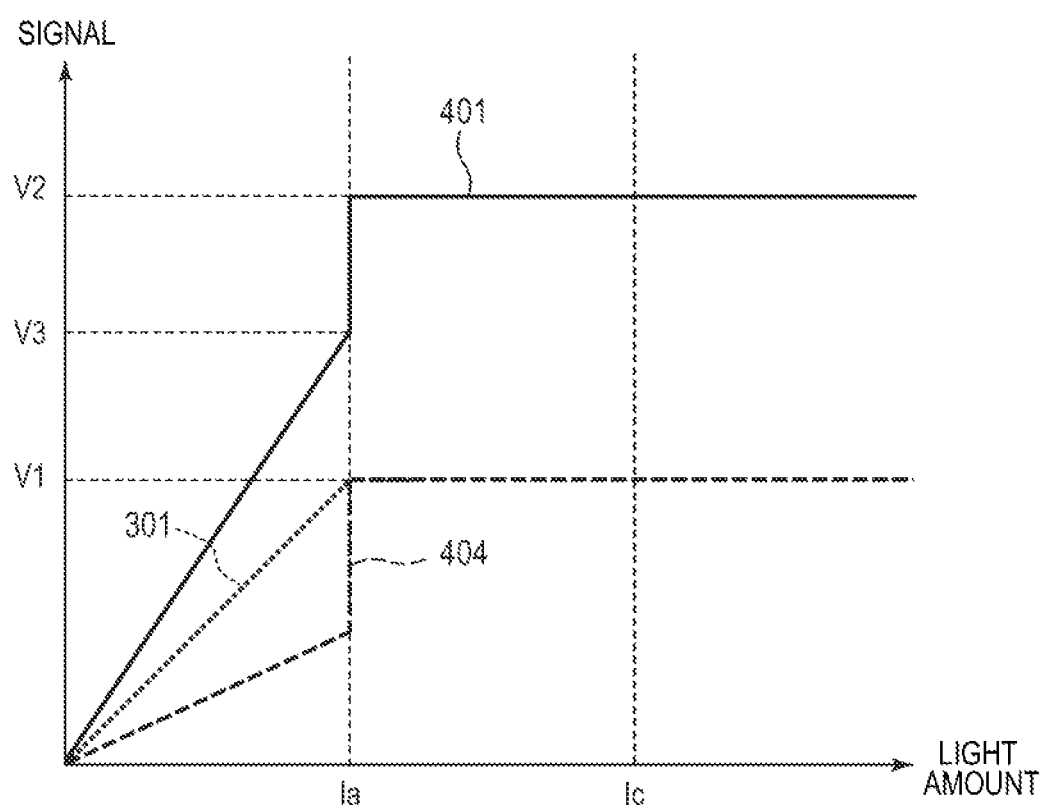
FIG. 12 is a graph illustrating an input/output characteristic obtained by the signal processing method in the solid state imaging device according to the third embodiment of the present invention.

FIG. 12 is a graph illustrating an example of the input/output characteristic obtained by the signal processing method of the present embodiment. The input/output characteristic 404 in FIG. 12 corresponds to the input/output characteristic 302 in FIG. 6. In the input/output characteristic 404 illustrated in FIG. 12, the signal level is replaced by V1 in the input light amount Ia or more. As a result, the input/output characteristic 401 is the signal level V2 when the input light amount is equal to or greater than Ia or the signal level is equal to or greater than V3, as in the case of the first embodiment illustrated in FIG. 6.

As described above, according to the present embodiment, there is provided a photoelectric conversion device which can reduce the effect of signal saturation on signal quality as in the first embodiment. Further, in the present embodiment, while the adder 120 performs the addition process for outputting the signal OUT1+OUT2, the adder 120 does not perform the replacement process for replacing the output signal with the signal at the signal level V2. The function of this replacement process is not performed by the adder 120, but is performed by the gain addition unit 110 or the offset addition unit 111 for the signal OUT1 or the signal OUT2. Therefore, the circuit scale of the adder 120 is reduced, thereby reducing the circuit scale of the DSP 108.

Fourth Embodiment

Figure 13:
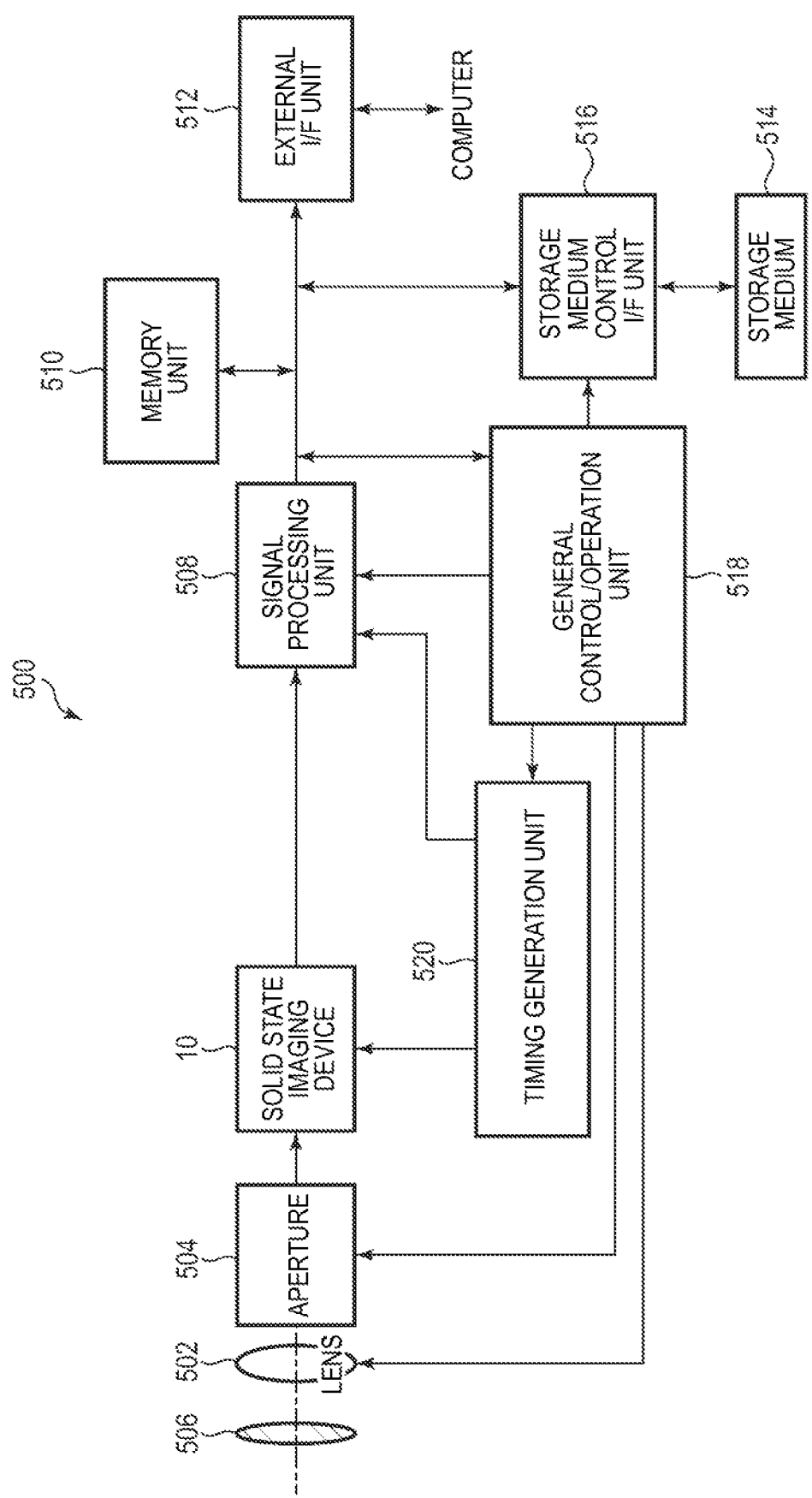
FIG. 13 is a block diagram illustrating a configuration example of an imaging system according to a fourth embodiment of the present invention.

An imaging system according to a fourth embodiment of the present invention will be described with reference to FIG. 13. FIG. 13 is a block diagram illustrating a schematic configuration of an imaging system according to the present embodiment. The solid state imaging device 10 illustrated in FIG. 13 is the solid state imaging device described in the above-described first to third embodiments. That is, the imaging system 500 according to the present embodiment is an example of a photoelectric conversion system to which the solid-state imaging devices (photoelectric conversion device) described in the above-described first to third embodiments can be applied. Note that, in the first to third embodiments, the DSP 108 is included in the solid state imaging device, but in FIG. 13, the signal processing unit 508 corresponding to the DSP 108 is illustrated as a block different from the solid state imaging device 10.

The imaging system 500 according to the present embodiment is not limited to but, can be applied to digital still cameras, digital camcorders, camera heads, copiers, fax machines, mobile phones, in-vehicle cameras, observation satellites or the like.

The imaging system 500 illustrated in FIG. 13 includes a solid state imaging device 10, a lens 502, an aperture 504, a barrier 506, a signal processing unit 508, a timing generation unit 520, a general control/operation unit 518. Further, the imaging system 500 includes a memory unit 510, storage medium control I/F unit 516, and an external I/F unit 512.

The lens 502 captures an optical image of an object onto an imaging area 100 of the solid state imaging device 10. The aperture 504 changes a light amount passing through the lens 502. The barrier 506 protects the lens 502. The solid state imaging device 10 is configured as in the above-described embodiment, and outputs a signal based on the optical image captured by the lens 502 to the signal processing unit 508. The signal output from the solid state imaging device 10 includes an A signal output from the photoelectric conversion element 101 of the photoelectric conversion unit 103 and a B signal output from the photoelectric conversion element 102.

The signal processing unit 508 performs desired processes, correction, data compression, or the like on the signal output from the solid state imaging device 10. The signal processing unit 508 includes the DSP 108. The processes performed by the signal processing unit 508 includes the generation of the image data corrected by the signal processes described in the above-described embodiment, the acquisition of the distance information to the object based on the A signal and the B signal, or the like. The signal processing unit 508 may be mounted on the same substrate as the solid state imaging device 10, or may be mounted on another substrate. Further, a part of the function of the signal processing unit 508 may be mounted on the same substrate as the solid state imaging device 10, and another part of the function of the signal processing unit 508 may be mounted on another substrate. The solid state imaging device 10 may output not a digital signal but an analog signal before AD conversion. In this case, the signal processor 508 may further include an AD converter 107.

The timing generation unit 520 outputs various timing signals to the solid state imaging device 10 and the signal processing unit 508. The general control/operation unit 518 is a control unit that controls driving and arithmetic processes of the entire solid state imaging system 500. Herein, the timing signal or the like may be input from the outside of the imaging system 500, and the imaging system 500 may include at least the imaging device 10 and the signal processing unit 508 for processing the imaging signal output from the solid state imaging device 10.

The memory unit 510 is a frame memory unit for temporarily storing image data. The storage medium control I/F unit 516 is an interface unit for recording or reading image data on or from the storage medium 514. The external I/F unit 512 is an interface unit for communicating with an external computer or the like. The storage medium 514 is a removable storage medium such as a semiconductor memory for recording or reading image data.

Thus, by configuring the imaging system 500 to which the solid-state imaging device and the signal processing method according to the first to third embodiments are applied, a high-performance imaging system capable of acquiring a high-quality image having a wide dynamic range can be realized.

Fifth Embodiment

Figure 14A:
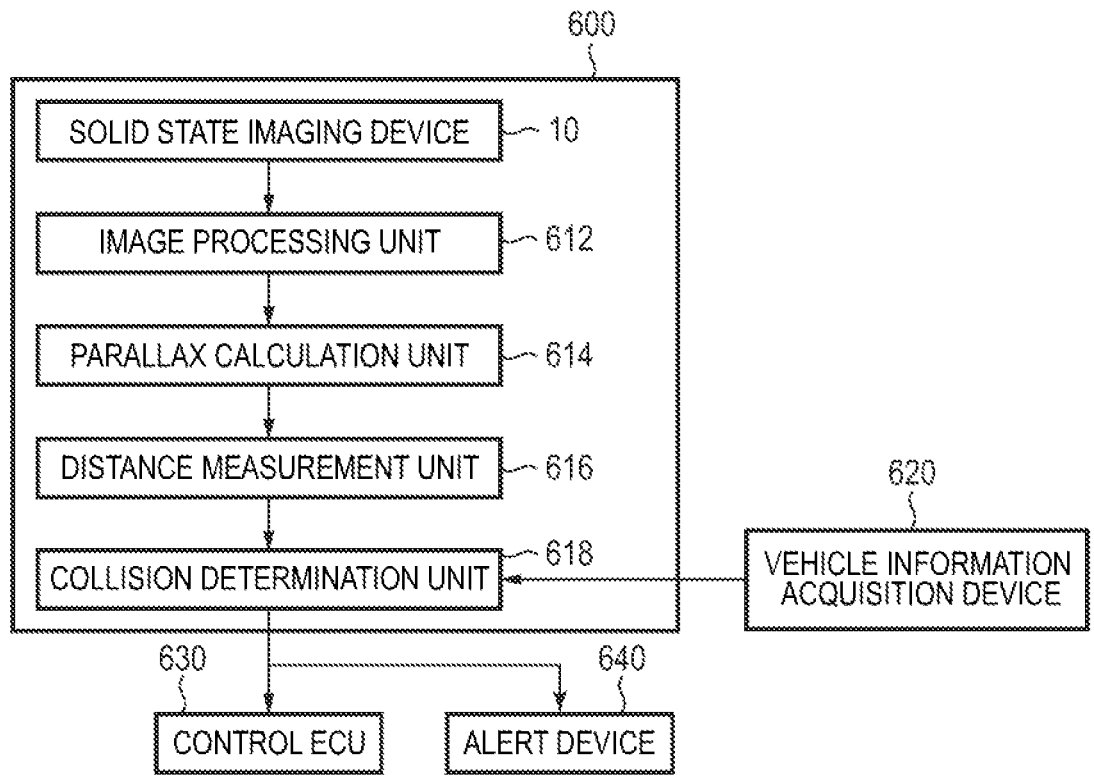
FIG. 14A and FIG. 14B are diagrams illustrating a configuration example of an imaging system and a moving body according to a fifth embodiment of the present invention.
Figure 14B:
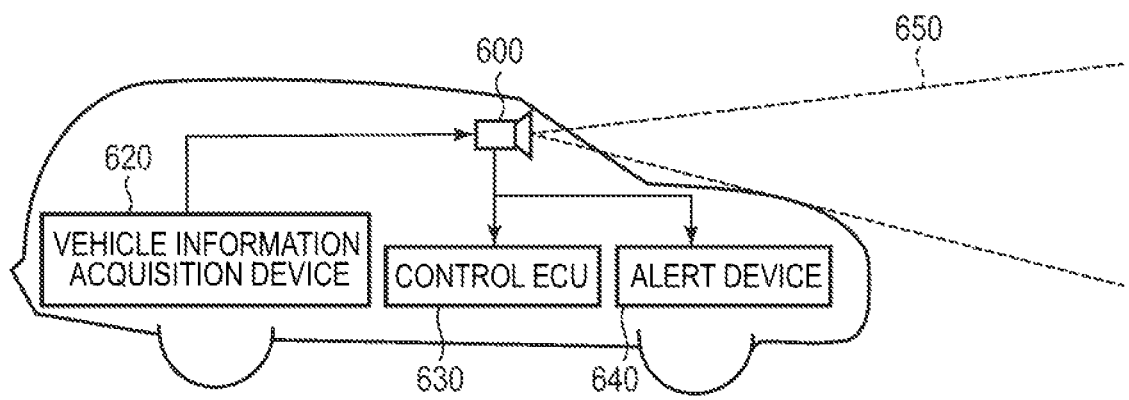

FIG. 14A and FIG. 14B are diagrams illustrating a configuration of an imaging system 600 and a moving body according to the present embodiment. FIG. 14A illustrates an example of an imaging system related to an in-vehicle camera. An imaging system 600 has a solid state imaging device 10 according to any one of the above-described the first to third embodiments. The imaging system 600 has an image processing unit 612 that performs image processing on a plurality of image data acquired by the solid state imaging device 10 and a parallax calculation unit 614 that calculates a parallax (a phase difference of parallax images) from the plurality of image data acquired by the imaging system 600. Further, the imaging system 600 has a distance measurement unit 616 that calculates a distance to the object based on the calculated parallax and a collision determination unit 618 that determines whether or not there is a collision possibility based on the calculated distance. Herein, the parallax calculation unit 614 and the distance measurement unit 616 are an example of a distance information acquisition unit that acquires distance information on the distance to the object. That is, the distance information is information on a parallax, a defocus amount, a distance to an object, or the like. The collision determination unit 618 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by a combination thereof.

The imaging system 600 is connected to the vehicle information acquisition device 620 and can acquire vehicle information such as a vehicle speed, a yaw rate, a steering angle, or the like. Further, the imaging system 600 is connected to a control ECU 630, which is a control device that outputs a control signal for causing a vehicle to generate braking force based on a determination result by the collision determination unit 618. That is, the control ECU 630 is an example of the distance information acquisition unit. Further, the imaging system 600 is also connected to an alert device 640 that issues an alert to the driver based on a determination result by the collision determination unit 618. For example, when the collision probability is high as the determination result of the collision determination unit 618, the control ECU 630 performs vehicle control to avoid a collision or reduce damage by applying a brake, pushing back an accelerator, suppressing engine power, or the like. The alert device 640 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 600. FIG. 14B illustrates the configuration of the imaging system 600 when a front area of a vehicle (a capturing area 650) is captured. The vehicle information acquisition device 620 sends an instruction to operate the imaging system 600 to perform imaging.

Thus, by configuring the imaging system 600 and the moving body to which the solid state imaging device and the signal processing method according to the first to third embodiments are applied, a high-performance imaging system capable of acquiring high-quality images and a moving body capable of performing control with high accuracy can be realized.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a moving body (moving apparatus) such as a ship, an airplane, an industrial robot, for example. In addition, the imaging system can be widely applied to a device which utilizes object recognition such as an intelligent transportation system (ITS) or the like, without being limited to moving bodies.

Modified Embodiment

The present invention is not limited to the above-described embodiment, and various modifications can be applied.

For example, in the above-described embodiment, the saturation is detected by the DSP 108 at the subsequent stage of the AD converter 107, but the voltage of not only the digital signal after AD conversion but also the analog signal before AD conversion may be saturated at the upper limit of the dynamic range of the circuit. Thus, the embodiments described above may be configured to detect voltage saturation of an analog signal instead of detecting saturation of a digital signal.

Further, in the above-described embodiment, the photoelectric conversion unit 103 has been described as including of photoelectric conversion elements 101, 102 which are divided into two right and left parts, but may be including photoelectric conversion elements which are divided into two upper and lower parts. Further, vertical and horizontal divisions may be used together, or the number of divisions may be three or more. The application of the output signal from the divided photoelectric conversion element is not limited to focus detection, but is also applicable to applications such as three-dimensional images, distance detection sensors, and light field sensors or the like.

Further, in the above-described embodiment, two signal output lines 105 are arranged in each column, and the A signal and the B signal are output via separate signal output lines 105, but the solid state imaging device may be configured so that a single signal output line 105 is arranged in each column. In this case, for example, the A signal and the A+B signal are read out at different timings, and the A signal is subtracted from the A+B signal to calculate the B signal. The subsequent signal processing is the same as in the above-described embodiment.

Further, in the first embodiment, the case where the output signal from the photoelectric conversion element 203 saturates in the circuit unit has been described, but the same signal processing as in the first embodiment can also be applied to the case where saturation occurs in the photoelectric conversion element 203 before saturation occurs in the circuit unit.

In a solid state imaging device including a large number of pixels, defects may occur in some of the pixels. In a typical pixel defect correction, data of a defective pixel is acquired in advance, and a signal corresponding to a position of a defective pixel is interpolated by a signal of a non-defective pixel around the defective pixel in accordance with an imaging environment. According to the signal processing method of the above-described embodiment, when one of the pixel outputting the A signal and the pixel outputting the B signal is a defective pixel, it is also possible to calculate the other signal level by the signal processing as described above.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. For example, it should be understood that examples in which a part of the configuration of one embodiment is added to another embodiment, or examples in which a part of the configuration of another embodiment is replaced are also embodiments of the present invention.

This application claims the benefit of Japanese Patent Application No. 2020-093404, filed May 28, 2020, which is hereby incorporated by reference herein in its entirety.

What is claimed is:

1. A photoelectric conversion device comprising:
a photoelectric conversion unit including one microlens and a plurality of photoelectric conversion elements;
a signal line configured to transmit a signal from the photoelectric conversion unit;
a readout circuit electrically connected to the signal line, and configured to read out a first signal based on charges accumulated by a first photoelectric conversion element of the plurality of photoelectric conversion elements and a second signal based on charges accumulated by a second photoelectric conversion element of the plurality of photoelectric conversion elements; and
a signal processing circuit electrically connected to the readout circuit, and configured to, (1) generate a determination result based on at least one of a level of the first signal and a level of the second signal, (2) output a third signal obtained by adding the first signal and the second signal in a case when the determination result indicates that the at least one of the level of the first signal and the level of the second signal is smaller than a predetermined signal level, and (3) output a fourth signal having a level relating to the determination result in a case when the determination result indicates that the at least one of the level of the first signal and the level of the second signal is larger than the predetermined signal level.

2. The photoelectric conversion device according claim 1, wherein the signal processing circuit outputs the fourth signal when the first signal or the second signal is at a saturation level.

3. The photoelectric conversion device according to claim 1, wherein the fourth signal has the level obtained by adding a saturation level of the first signal and a saturation level of the second signal.

4. The photoelectric conversion device according to claim 2,
wherein the readout circuit includes an analog-to-digital converter,
wherein the first signal and the second signal are digital signals output from the analog-to-digital converter, and
wherein the saturation level is an upper limit value of each of the digital signals.

5. The photoelectric conversion device according to claim 1 comprising a photoelectric conversion area including a plurality of the photoelectric conversion units,
wherein the signal processing circuit, according to the determination result based on the at least one of the first signal and the second signal read out from a first photoelectric conversion unit of the plurality of photoelectric conversion units, output the third signal or the fourth signal corresponding to a second photoelectric conversion unit of the plurality of photoelectric conversion units.

6. The photoelectric conversion device according to claim 1, wherein the signal processing circuit outputs the third signal or the fourth signal further according to the determination result based on a difference between the first signal and the second signal.

7. The photoelectric conversion device according to claim 6, wherein the signal processing circuit outputs the fourth signal when the first signal or the second signal is at a saturation level and an absolute value of a difference between the first signal and the second signal is less than a predetermined threshold.

8. The photoelectric conversion device according to claim 6, wherein the signal processing circuit outputs the fourth signal when one of the first signal and the second signal is at a saturation level and the other is equal to or greater than a predetermined threshold.

9. The photoelectric conversion device according claim 1, wherein the signal processing circuit outputs the third signal or the fourth signal further according to the determination result based on a value of one of the first signal and the second signal not having reached a saturation level.

10. The photoelectric conversion device according to claim 1, wherein the signal processing circuit outputs:

the third signal by replacing the second signal with a saturation level and then adding the first signal and the replaced second signal when the first signal is at the saturation level; and the third signal by replacing the first signal with the saturation level and then adding the replaced first signal and the second signal when the second signal is at the saturation level.

11. A moving body comprising:

the photoelectric conversion device according to claim 1;

a distance information acquisition circuit configured to acquire distance information on a distance from the photoelectric conversion device to an object, form a parallax image based on signals from the photoelectric conversion device; and a control circuit configured to control the moving body based on the distance information.

12. A photoelectric conversion system comprising:

a photoelectric conversion device that includes a photoelectric conversion unit including one microlens and a plurality of photoelectric conversion elements, a signal line configured to transmit a signal from the photoelectric conversion unit, and a readout circuit electrically connected to the signal line, and configured to read out a first signal based on charges accumulated by a first photoelectric conversion element of the plurality of photoelectric conversion elements and a second signal based on charges accumulated by a second photoelectric conversion element of the plurality of photoelectric conversion elements; and a signal processing circuit electrically connected to the readout circuit, and configured to, (1) generate a determination result based on at least one of a level of the first signal and a level of the second signal, (2) output a third signal obtained by adding the first signal and the second signal in a case when the determination result indicates that the at least one of the level of the first signal and the level of the second signal is smaller than a predetermined signal level, and (3) output a fourth signal having a level relating to the determination result in a case when the determination result indicates that the at least one of the level of the first signal and the level of the second signal is larger than the predetermined signal level.

13. A signal processing method processing a signal output from a photoelectric conversion unit including one microlens and a plurality of photoelectric conversion elements, the signal processing method comprising:

reading out a first signal based on charges accumulated by a first photoelectric conversion element of the plurality of photoelectric conversion elements and a second signal based on charges accumulated by a second photoelectric conversion element of the plurality of photoelectric conversion elements; and according to a determination result based on at least one of a level of the first signal and a level of the second signal, (1) outputting a third signal obtained by adding the first signal and the second signal in a case when the determination result indicates that the at least one of the level of the first signal and the level of the second signal is smaller than a predetermined signal level, and (2) outputting a fourth signal having a level relating to the determination result in a case the determination result indicates that the at least one of the level of the first signal and the level of the second signal is larger than the predetermined signal level.

* * * * *